United States Patent [19]
Ness et al.

[11] Patent Number: 5,949,806
[45] Date of Patent: Sep. 7, 1999

[54] HIGH VOLTAGE CABLE INTERLOCK CIRCUIT

[75] Inventors: Richard M. Ness, San Diego; William N. Partlo, Poway; Richard L. Sandstrom, Encinitas, all of Calif.

[73] Assignee: Cymer, Inc., San Diego, Calif.

[21] Appl. No.: 09/100,311

[22] Filed: Jun. 19, 1998

[51] Int. Cl.[6] ..................................................... H01S 3/00
[52] U.S. Cl. ............................................. 372/38; 307/106
[58] Field of Search .......................... 372/38, 82; 307/106

[56] References Cited

U.S. PATENT DOCUMENTS

| | | | |
|---|---|---|---|
| 4,549,091 | 10/1985 | Fahlen et al. | 307/106 |
| 5,138,622 | 8/1992 | Friede et al. | 372/38 |
| 5,142,166 | 8/1992 | Birx | 387/419 |
| 5,177,754 | 1/1993 | Ball et al. | 382/38 |
| 5,309,462 | 5/1994 | Taylor et al. | 372/38 |
| 5,313,481 | 5/1994 | Cook et al. | 372/38 |
| 5,315,611 | 5/1994 | Ball et al. | 372/38 |
| 5,319,665 | 6/1994 | Birx | 372/69 |
| 5,359,279 | 10/1994 | Gidon et al. | 372/82 |
| 5,448,580 | 9/1995 | Brix et al. | 372/38 |
| 5,514,918 | 5/1996 | Inatomi et al. | 307/106 |

OTHER PUBLICATIONS

W.S. Melville, "The use of Saturable Reactors as Discharge Devices for Pulse Generators," *Radio Section*, Paper No. 1034, pp. 185–207, Sep. 15, 1950.

Birx et. al, "Basic Principles Governing the Design of Magnetic Switches," *Lawrence Livermore Laboratory Publication UCID–18831*, Nov. 18, 1980.

E.M. Lassiter, P.R. Johannessen, R.H. Spencer, "High–Power Pulse Generation Using Semiconductors and Magnetic Cores," AIEE Summer General Meeting, pp. 511–517, Nov. 1960.

H. Yanagise, et. al., "Solid–State Power Device for Excimer Laser," Proceedings of the Joint Conference on Electronic Devices and Semiconductor Power Conversion, Sep. 13, 1995.

Cymer ELS5600 Data, DOC. ID:ICLACY00.EPS.

Yatsui, "Industrial application of pulse power and particle beams," Laser and Particle Beams (1989), vol. 7, part 4, pp. 733–741, Printed in Northern Ireland.

*Primary Examiner*—Leon Scott, Jr.
*Attorney, Agent, or Firm*—William B. Tiffany

[57] ABSTRACT

A low level current travels from a source through the high voltage cable from the remote end to the local end of the cable in a pulse power circuit. The current is detected, and a signal is generated by a bias sensing circuit. If the low level current is not positively detected, no pulse is allowed to occur, preventing accidental damage and high voltage hazard. In some embodiments, the current is coupled to ground at the local end through an isolation inductor, commonly a secondary winding of a high voltage pulse transformer. The low level current then passes through a shunt resistor from ground to an input terminal of the source, thus completing the circuit and generating a voltage between the source input terminal and ground that confirms continuity of the circuit through the high voltage cable.

13 Claims, 2 Drawing Sheets

HIGH VOLTAGE CABLE INTERLOCK CIRCUIT

CROSS REFERENCE TO RELATED APPLICATIONS

This application is related to Birx et al. U.S. application Ser. No. 08/739,873, filed Oct. 31, 1996, and to Partlo et al. U.S. application Ser. No. 08/990,848, filed Dec. 15, 1997, the disclosures of each of which are incorporated herein by reference in their entirety.

FIELD OF THE INVENTION

The present invention relates generally to pulse power sources, particularly relating to magnetic modulators, more particularly pertaining to excimer lasers and other gas discharge lasers.

BACKGROUND

In many pulsed high voltage applications, a high voltage cable transfers a pulse of energy from a local source location to a remote load location. The cable is often connectorized, which allows it to be disconnected for maintenance or other purposes. In such cases, it can become a safety hazard if the high voltage cable is left disconnected at the load end of the cable but remains connected at the source end, since an individual could come into contact with (potentially lethal) pulsed high voltage at the disconnected end of the cable. It is therefore advantageous to detect if the cable is not fully connected and, if not, to prevent the application of high voltage.

Conventional system interlocks have been used to detect an open high voltage connection at the load end of a system. A disadvantage of most of these interlocks is that at least one pulse must be generated at the source and transferred into the cable before the fault is detected. Even one pulse may be enough to cause serious injury to an individual who contacts an open cable connector.

In some cases, a cable connector may not be securely inserted all the way into a mating receptacle, leaving a gap between high voltage connector contacts. In normal operation, the gap may be close enough that the high voltage pulse is able to "jump" the gap by arcing or flashing over the insulator material in the connector to the opposing connector contacts. This can be detected as "normal" operation, since the pulse is successfully transmitted to the load. However, the arcing across the gap can eventually cause severe damage to the connector contacts and insulator surface and may result in more severe faults later in time.

What is needed in the art is a simple and reliable interlock circuit and method for detecting inadequate integrity in a high voltage cable. Additionally, what is needed in the art is a simple and reliable circuit and method for detecting integrity faults in a high voltage cable for pulse power applications. Further, what is needed in the art is a simple and reliable circuit and method for detecting integrity faults in a high voltage cable for pulse power applications, such that no pulse will be generated if a fault exists.

SUMMARY OF THE INVENTION

The present invention relates generally to pulse power sources, particularly relating to magnetic modulators, more particularly pertaining to excimer lasers and other gas discharge lasers.

In accordance with the invention, in a pulse power circuit a low voltage power source drives a low level current from an output terminal through the high voltage cable from the remote load end of the cable back to the local source end. There the low level current is detected, and a signal is generated by a bias sensing circuit. If the low level current is not positively detected, the pulsed high voltage is inhibited, preventing accidental damage and high voltage shock hazard. An advantage, therefore, in accordance with the invention, is that no pulse is allowed to occur, if the high voltage cable is not securely connected.

In some embodiments, the high voltage cable includes one or more high voltage pulse connectors. The use of a low level dc current source ensures that the cable is securely connected, since the low level current cannot "jump" a gap, but instead will flow only through a physical contact between connector contacts.

In some embodiments, the high voltage cable and the load are interconnected through a magnetic pulse compressor circuit, i.e., a magnetic modulator circuit. In some embodiments, the low level dc current is coupled into the magnetic pulse compressor circuit through an isolation inductor. In some embodiments, the low level dc current is coupled to ground at the source end of the high voltage cable through a second isolation inductor, commonly a secondary winding of a high voltage pulse transformer.

The low level dc current then passes through a shunt resistor from ground to an input terminal of the low voltage power source having a polarity opposite that of the output terminal. This completes the circuit and generates a voltage between the low voltage source terminal and ground, providing a signal that confirms continuity through the circuit including the high voltage cable.

In some embodiments, the low voltage power source is located at the source end of the high voltage cable, and delivers low level dc current to the load end of the high voltage cable through an independent low voltage cable. In some embodiments, low level dc current is divided at the load end of the cable into two branches. One current branch travels through the high voltage cable back to the source end of the cable, where it provides a signal to detect the continuity of the high voltage cable. The second current branch presaturates the magnetic switches of the magnetic pulse compressor circuit and travels back to the input terminal of the low voltage source through a third isolation inductor and a low voltage cable.

Thus in accordance with the invention, a simple and reliable interlock circuit and method are provided for detecting inadequate integrity in a high voltage cable, particularly for pulse power applications. Further, in accordance with the invention, any failure to detect low level current through the high voltage cable causes pulsed high voltage to be inhibited, such that no pulse will be generated if an open circuit exists.

BRIEF DESCRIPTION OF THE DRAWINGS

The present invention may be better understood, and its numerous objects, features, and advantages made apparent to those skilled in the art by referencing the accompanying drawings. For simplicity and ease of understanding, common numbering of elements within the illustrations is employed where an element is the same in different drawings.

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings are not to be considered in a limiting sense as it is understood that the present invention is in no way limited to the embodiments illustrated.

The present invention relates generally to pulse power sources, particularly relating to magnetic modulators, more particularly pertaining to excimer lasers and other gas discharge lasers.

Figure 1:
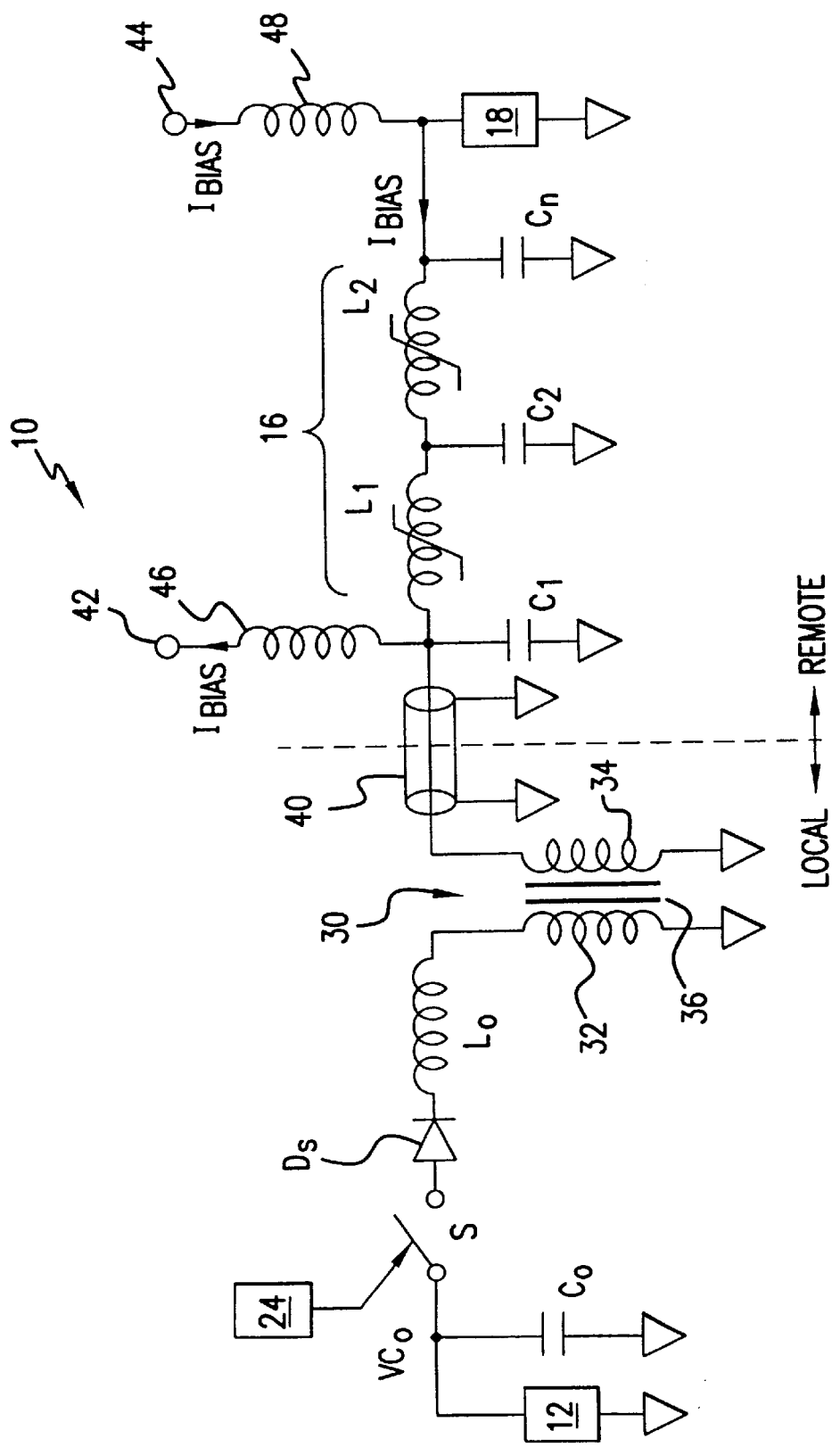
FIG. 1 is a simplified schematic diagram of a typical magnetic modulator circuit, familiar in the art.

In an embodiment of the invention, the pulsed high voltage source is a magnetic modulator (see for example W. S. Melville, "The use of Saturable Reactors as Discharge Devices for Pulse Generators," *Radio Section*, Paper No. 1034, pp. 185–207, Sept. 15, 1950). FIG. 1 is a simplified schematic diagram of a typical magnetic modulator circuit 10 familiar in the art. Circuit 10 generally comprises a DC charging power supply 12, an initial operating stage capacitor $C_0$, a solid state triggered switch S, and a pulse compressor circuit 16 for compressing the duration and increasing the peak power of pulses applied to a load 18, typically a pulsed gas discharge such as an excimer laser.

Pulse compressor circuit 16 comprises a ladder network of magnetic pulse compression stages containing banks of capacitors $C_1, C_2, \ldots C_{n-1}$ and $C_n$ and one or more magnetic switch elements represented by saturable inductors $L_1, L_2, \ldots, L_{n-1}$. Thus, a first saturable inductor $L_1$ is connected between capacitors $C_1$ and $C_2$, a second saturable inductor $L_2$ may be connected in series between capacitors $C_2$ and $C_3$, . . . , and a saturable inductor $L_{n-1}$ is connected in series between $C_{n-1}$ and $C_n$.

Circuit 10 further comprises preferably a diode $D_s$ connected in series with triggered switch S to ensure that circuit 10 is nonconductive to reverse current. illustratively circuit 10 further comprises an inductor $L_0$ selected in conjunction with initial operating stage capacitor $C_0$ to provide an LC time constant to slow the buildup of current through triggered switch S that could otherwise damage triggered switch S. Triggered switch S is typically interconnected with low level triggering circuitry 24 familiar in the art.

Magnetic modulator circuit 10 further comprises an optional pulse transformer 30, typically having a primary winding 32 interconnected with initial operating stage capacitor $C_0$ through triggered switch S, a secondary winding 34 interconnected with pulse compressor circuit 16, and a pulse transformer core 36. Pulse transformer 30 is configured such that the voltage developed across secondary winding 34 is greater than the voltage applied across primary winding 32.

Pulse transformer 30 is typically interconnected with pulse compressor circuit 16 through a high voltage cable 40, preferably a coaxial cable. High voltage cable 40 advantageously connects the circuit elements shown on the left side of magnetic modulator circuit 10, labeled LOCAL in FIG. 1, with the circuit elements shown on the right side of magnetic modulator circuit 10, labeled REMOTE in FIG. 1. For convenience high voltage cable 40 typically incorporates a high voltage pulse current connector (not shown) of a design familiar in the art.

In operation initial operating stage capacitor $C_0$ is charged to initial voltage $VC_0$ by charging power supply 12. Low level triggering circuitry 24 initiates a low-level trigger signal, which causes triggered switch S to close, discharging a power pulse from previously charged initial operating stage capacitor $C_0$ through pulse transformer primary winding 32. Pulse transformer 30 steps up the voltage of the power pulse across secondary winding 34. The power pulse then propagates through high voltage cable 40 and enters compressor circuit 16, where the pulse width of the power pulse is narrowed and its pulse amplitude is increased as it propagates sequentially through ladder network of saturable inductors $L_1, L_2, \ldots, L_{n-1}$ of pulse compressor circuit 16 into load 18.

In some versions of magnetic modulator circuit 10, a forward or reverse bias current is applied through saturable inductors $L_1, L_2, \ldots, L_{n-1}$ to presaturate the magnetic cores of the saturable inductors (see for example Birx et al. U.S. application Ser. No. 08/739,873, filed Oct. 31, 1996). In some configurations the bias current, illustratively $I_{bias}$, is supplied by bias current supplies (not shown), illustratively connected to magnetic modulator circuit 10 at points 42, 44, which are typically isolated from the high voltage power pulse through respective first and second bias inductors 46, 48.

A safety hazard exists if high voltage cable 40 is left disconnected at the REMOTE end of cable 40 but remains connected at the LOCAL end, since an individual could come into contact with (potentially lethal) pulsed high voltage at the disconnected end of the cable. Further, a cable that is superficially connected but has a concealed gap potentially allows high voltage arcing across the gap, eventually causing severe damage to connector contacts and insulator surfaces, and leading to more severe faults later in time. It is therefore advantageous to detect if the cable is not fully connected and, if not, to inhibit any pulsed high voltage.

Figure 2:
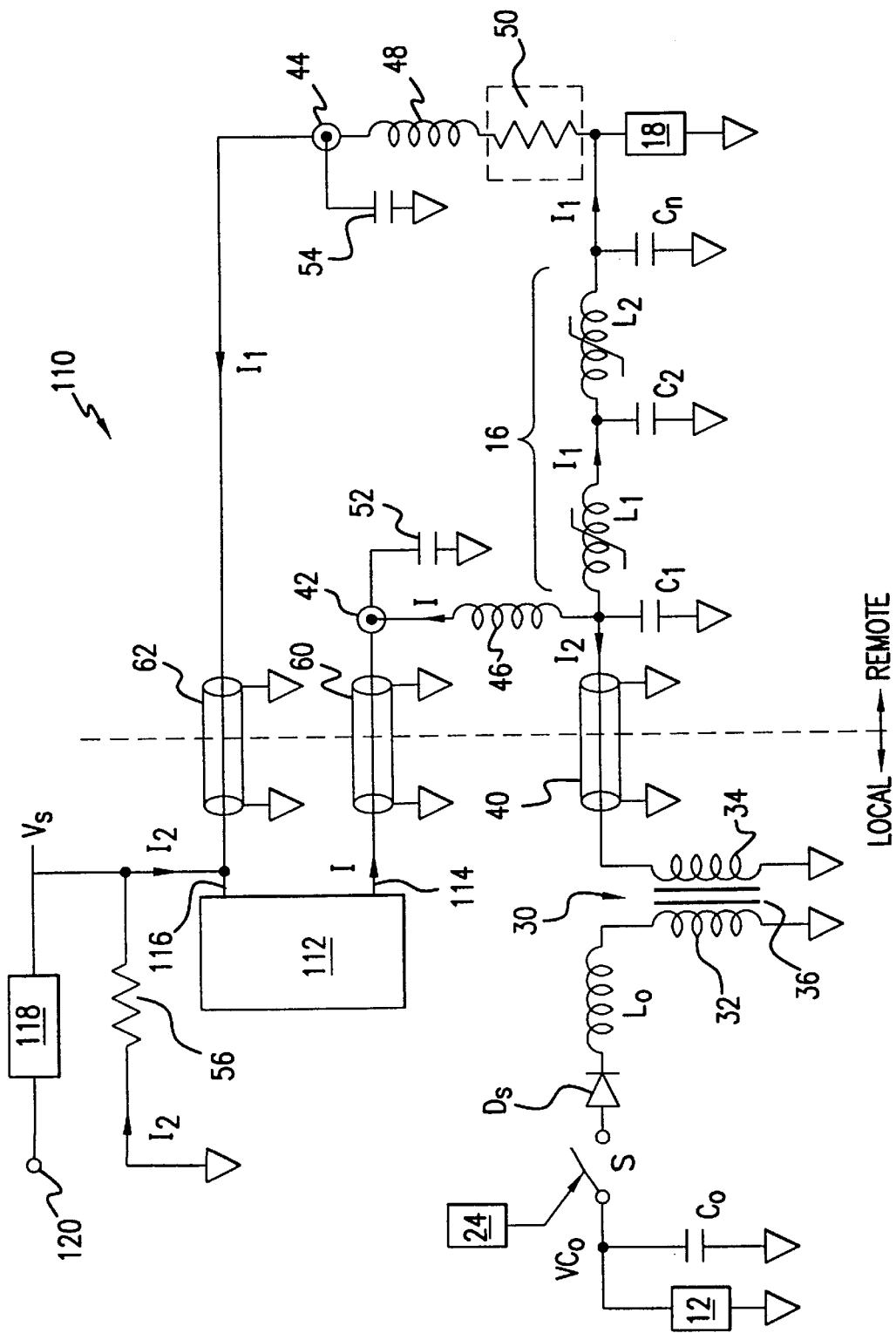
FIG. 2 is a simplified schematic diagram of a magnet modulator circuit incorporating a high voltage cable interlock circuit, in accordance with the invention.

FIG. 2 is a simplified schematic diagram of a magnet modulator circuit 110 incorporating a high voltage cable interlock circuit, in accordance with the invention. In the drawings, similar elements are designated by similar reference numbers and will not be described again in detail. Magnetic modulator circuit 110 has a high voltage cable 40 connecting local circuit elements (labeled LOCAL) with remote circuit elements (labeled REMOTE) and a dc reset bias current for the magnetic switches in the remote location.

A low voltage power supply 112 in the local location has an output terminal 114 interconnected through a low voltage cable 60 with first isolation inductor 46 at point 42 in the remote location of magnetic modulator circuit 110. Connected between point 42 and ground is a first filter capacitor 52. An opposite polarity output terminal 116 of low voltage power supply 112 is interconnected through a low voltage cable 62 with second isolation inductor 48 at point 44 in the remote location. Connected between point 44 and ground is a second filter capacitor 54.

Illustratively, first isolation inductor 46 has an inductance in the range of 0.1–10 mH, and second isolation inductor 48 has an inductance in the range of 0.025–2.5 mH. First and second filter capacitors 52 and 54 each have capacitances in the range of 0.1–10 $\mu F$. The values will vary, depending, e.g. upon the frequency of the power pulse being delivered.

Also connected to opposite polarity output terminal 116 of low voltage power supply is a shunt resistor 56 to ground in parallel with a bias current sensing circuit 118 having an output terminal 120. A series resistor 50, connected in series with second isolation inductor 48, is shown inside broken lines in FIG. 2. Typically series resistor 50 is not a separate circuit element, but is an internal resistance of isolation inductor 48. Illustratively, the value of series resistance 50 is in the range of 0.025–2.5 ohms. Values will vary, depending, e.g. upon inductor structural details and on the value of inductance.

In operation, a low level dc bias current I is generated at output terminal 114 of low voltage power supply 112 and is transmitted to the remote location through low voltage cable 60. Bias current I is then coupled into the high voltage magnetic modulator circuit 110 through first isolation inductor 46 with low voltage first filter capacitor 52. Bias current I is next divided into first current $I_1$ traveling through magnetic switch(es) 16 and back to the local location through second isolation inductor 48 and low voltage cable 62, and second current $I_2$ traveling back to the local location through high voltage cable 40.

Upon traveling through low voltage cable 62, first current $I_1$ returns directly to opposite polarity output terminal 116 of low voltage power supply 112. Upon traveling through high voltage cable 40, second current $I_2$ is conducted to ground through a third isolation inductor, represented in the embodiment as the secondary winding 34 of pulse transformer 30. In other embodiments the third isolation inductor is a separate circuit element. Second current $I_2$ then returns to opposite polarity output terminal 116 from ground through shunt resistor 56.

Shunt resistor 56 in the return circuit of second current $I_2$ determines the ratio $I_1/I_2$ between first current $I_1$ through low voltage cable 62 and second current $I_2$ through high voltage cable 40. Of importance, shunt resistor 56 also develops a voltage $V_S$ in response to second current $I_2$ to operate bias current sensing circuit 118. The presence of non-zero voltage $V_S$ at bias current sensing circuit 118 verifies that second current $I_2$ has traveled back through high voltage cable 40, confirming the integrity of high voltage cable 40 at both ends. Bias current sensing circuit 118 detects the presence or absence of second current $I_2$. If no voltage $V_S$ is detected (no second current $I_2$), then a high voltage cable fault is determined to exist.

Bias current sensing circuit 118 then generates signal(s) at output terminal 120 that typically disable triggering circuitry 24 to prevent discharge of initial operating stage capacitor $C_0$ through triggered switch S, turn off charging power supply 12, discharge initial operating stage capacitor $C_0$ to ground through a bleeder resistor (not shown), and alert an operator that the fault exists. Because low voltage is used, second current $I_2$ is unable to arc across any gaps in the high voltage cable, and therefore will identify any such gap as a fault.

Illustratively, low voltage power supply 112 delivers bias current I at a voltage in the range of 0–50 volts into magnetic modulator circuit 110. Bias current I branches into first current $I_1$ through series resistor 50 and second current $I_2$ through shunt resistor 56 (provided that high voltage cable is intact). Generally all other circuit resistances are negligible. If the values of resistors 50 and 56 are approximately 0.5 ohm and 1.0 ohm, respectively, then first and second currents $I_1$ and $I_2$ are approximately 10.0 A and 5.0 amps, respectively, and the ratio $I_1/I_2$ between first current $I_1$ through low voltage cable 62 and second current $I_2$ through high voltage cable 40 is 2:1. The values will vary, depending, e.g. upon the relative bias currents required for pulse transformer 30 and for magnetic switches in pulse compressor circuit 16, respectively.

Under the described conditions, substantially the entire voltage of low voltage power supply 112 appears across shunt resistor 56, which is the only resistance in the second current $I_2$ branch of magnetic modulator circuit 110, and is detected by bias current sensing circuit 118. Bias current sensing circuit 118 thereupon generates a signal at output terminal 120 indicating that high voltage cable 40 is intact.

If, however, high voltage cable 40 is not intact, then second current $I_2$ is interrupted. With substantially zero current through shunt resistor 56, voltage $V_S$ is essentially shorted to ground through shunt resistor 56, so that bias sensing circuit 118 detects a substantially zero voltage $V_S$ and thereupon generates a signal at output terminal 120, indicating that high voltage cable 40 is not intact. First current $I_1$ continues to flow without interruption through low voltage cable 62. If desired in some embodiments, detection of first current $I_1$ provides an additional logic signal to verify that the high voltage cable interlock circuitry is functioning properly.

In the described embodiments, the bias current returning on the high voltage cable performs a secondary function in addition to the interlock by providing bias current for the pulse transformer used in the output of the local location. As with magnetic material pulse transformers familiar in the art, this dc current biases the transformer core into reverse saturation and thereby maximizes the core delta-B swing, while minimizing the amount of core material required. Further, the bias current returning through the low voltage cable performs the function of presaturating the magnetic switches, as described above in relation to FIG. 1.

Although in the described embodiment the polarities of currents I, $I_1$, $I_2$, and $I_{bias}$ are as shown in FIGS. 1 and 2, it will be apparent to those skilled in the art that embodiments having other bias current configurations with other polarities are also within the scope of the invention, with the polarities selected, for example, according to the desired biasing polarities of pulse transformer 30 and saturable inductors $L_1$, $L_2$, . . . , $L_{n-1}$.

While the embodiments described herein relate to magnetic modulator circuits, it will be apparent to those skilled in the art that embodiments relating to other pulse power circuit configurations are also included within the scope of the invention.

Thus in accordance with the invention, a simple and reliable interlock circuit and method are provided for detecting inadequate integrity in a high voltage cable, particularly for pulse power applications. Further, in accordance with the invention, any failure to detect low level current through the high voltage cable causes pulsed high voltage to be inhibited, such that no pulse is delivered into the high voltage cable if a fault exists. While embodiments of the present invention have been shown and described, it will be obvious to those skilled in the art that changes and modifications to these illustrative embodiments can be made without departing from the present invention in its broader aspects. Thus it should be evident that there are other embodiments of this invention which, while not expressly described above, are within the scope and spirit of the present invention. Therefore, it will be understood that the appended claims necessarily encompass all such changes and modifications as fall within the described invention's true scope and spirit; and further that this scope and spirit is not limited merely to the illustrative embodiments presented to demonstrate that scope and spirit.

What is claimed is:

1. A method of detecting an open high voltage cable interconnecting a pulse power source with a load, said high voltage cable having a source end and a load end, and inhibiting the delivery of pulsed high voltage into said high voltage cable, comprising:

generating a low level dc current;

driving said current through said high voltage cable in a direction from said load end toward said source end;

detecting said current proximate to said source end; and generating a signal in response to said current, indicating the presence or absence of said current.

2. The method according to claim 1, wherein said high voltage cable comprises at least one high voltage pulse connector.

3. The method according to claim 1, wherein said high voltage cable and said load are interconnected through a magnetic pulse compressor circuit.

4. The method according to claim 3, wherein said current is coupled into said magnetic pulse compressor circuit through a first isolation inductor.

5. The method according to claim 1, wherein said current is coupled from said source end to ground through a second isolation inductor.

6. The method according to claim 5, wherein:

said pulse power source and said high voltage cable are interconnected through a high voltage pulse transformer; and said second isolation inductor is a secondary winding of said pulse transformer.

7. The method according to claim 1, wherein said detecting further comprises:

passing said current through a shunt resistor proximate to said source end; and sensing the voltage developed across said shunt resistor due to the passing of said current through said shunt resistor.

8. The method according to claim 1, further comprising applying said signal in the absence of said current to inhibit the delivery of pulsed high voltage into said high voltage cable.

9. The method according to claim 1, wherein said generating further comprises:

generating said current with a low voltage power supply located proximate to said source end; and delivering said current from said low voltage power supply to said load end through a low voltage cable separate from said high voltage cable.

10. A method of detecting an open high voltage cable interconnecting a pulse power source with a load, said high voltage cable having a source end and a load end, wherein said high voltage cable comprises at least one high voltage pulse connector and wherein said high voltage cable and said load are interconnected through a magnetic pulse compressor circuit, and inhibiting the delivery of pulsed high voltage into said high voltage cable, comprising:

generating a low level dc current with a low voltage power supply located proximate to said source end;

delivering said current from said low voltage power supply to said load end through a low voltage cable separate from said high voltage cable;

coupling said current into said magnetic pulse compressor circuit through a first isolation inductor;

driving said current through said high voltage cable in a direction from said load end toward said source end;

coupling said current from said source end to ground through a second isolation inductor;

passing said current through a shunt resistor proximate to said source end;

sensing the voltage developed across said shunt resistor due to the passing of said current through said shunt resistor;

generating a signal in response to said voltage across said shunt resistor, indicating the presence or absence of said current; and applying said signal in the absence of said current to inhibit the delivery of pulsed high voltage into said high voltage cable.

11. A high voltage cable interlock circuit comprising:

a low voltage power supply for generating a low level dc current at a first output terminal;

a pulse power circuit connected to a load and interconnected with a pulse power source through a high voltage cable, said high voltage cable having a source end proximate said pulse power source and a load end opposite said source end, said pulse power circuit being interconnected with said first output terminal through a first isolation inductor and a low voltage cable separate from said high voltage cable;

a second isolation inductor located proximate said source end, said second isolation inductor connecting said source end of said high voltage cable to ground;

a shunt resistor connected between a second output terminal of said low voltage power supply and ground, said second output terminal having a polarity opposite the polarity of said first output terminal; and a bias current sensing circuit disposed to measure a voltage across said shunt resistor and to generate a signal in response to said voltage across said shunt resistor.

12. The circuit according to claim 11, wherein said pulse power circuit is a magnetic modulator circuit.

13. The circuit according to claim 11, further comprising a low voltage cable interconnecting said pulse power circuit and said second output terminal through a third isolation inductor different from first and second isolation inductors.

* * * * *

UNITED STATES PATENT AND TRADEMARK OFFICE
CERTIFICATE OF CORRECTION

PATENT NO. : 5,949,806
DATED : Sep. 7, 1999
INVENTOR(S) : Ricard M. Ness, et al

It is certified that error appears in the above-identified patent and that said Letters Patent is hereby corrected as shown below:

On the cover page: Item [56] Reference Cited, line 23, "Brix" should read --Birx--.

Signed and Sealed this

Eleventh Day of April, 2000

Attest:

Attesting Officer

Q. TODD DICKINSON

Director of Patents and Trademarks